(12) United States Patent
Mumtaz et al.

(10) Patent No.: US 8,077,437 B2
(45) Date of Patent: *Dec. 13, 2011

(54) INTEGRATED CIRCUITS AND POWER SUPPLIES

(75) Inventors: Asim Mumtaz, Cambridge (GB); Lesley Chisenga, Cambridge (GB)

(73) Assignee: Enecsys Limited, Cambridge (GB)

( * ) Notice: Subject to any disclaimer, the term of this patent is extended or adjusted under 35 U.S.C. 154(b) by 848 days.

This patent is subject to a terminal disclaimer.

(21) Appl. No.: 11/718,875

(22) PCT Filed: Nov. 7, 2005

(86) PCT No.: PCT/GB2005/050198

§ 371 (c)(1),
(2), (4) Date: May 15, 2008

(87) PCT Pub. No.: WO2006/048689

PCT Pub. Date: May 11, 2006

(65) Prior Publication Data

US 2008/0266922 A1    Oct. 30, 2008

(30) Foreign Application Priority Data

Nov. 8, 2004 (GB) .................................. 0424551.0
Nov. 8, 2004 (GB) .................................. 0424555.1

(51) Int. Cl.
*H02H 7/00* (2006.01)
(52) U.S. Cl. ........................................................ 361/18
(58) Field of Classification Search ...................... 361/18
See application file for complete search history.

(56) References Cited

U.S. PATENT DOCUMENTS

| 4,951,117 | A | * | 8/1990 | Kasai ............................. 257/334 |
| 5,138,422 | A | | 8/1992 | Fujii et al. |
| 5,539,238 | A | | 7/1996 | Malhi |
| 5,677,833 | A | | 10/1997 | Bingley |
| 6,046,470 | A | * | 4/2000 | Williams et al. .............. 257/328 |
| 6,130,458 | A | | 10/2000 | Takagi et al. |
| 6,191,456 | B1 | | 2/2001 | Stoisiek et al. |

(Continued)

FOREIGN PATENT DOCUMENTS

EP        0 576 271       12/1993

(Continued)

OTHER PUBLICATIONS

International Search Report for corresponding PCT/GB2005/050198 completed Jun. 28, 2006 by C. Wirner of the EPO.

*Primary Examiner* — Stephen W Jackson (57) ABSTRACT

We describe a semiconductor-on-insulator integrated circuit die comprising a substrate bearing a power conditioning circuit, the power conditioning circuit comprising at least two power devices, a lateral power device and a vertical power device. The power conditioning circuit comprises: a DC input to receive DC power, an AC output for connection to AC mains; a DC-to-DC converter having an input coupled to said DC input; a DC-to-AC converter having a DC input and an AC output to convert DC power to AC power for mains output; and a DC voltage regulator coupled between the output of said DC-to-DC converter and the input of said DC-to-AC converter to regulate said DC voltage input to said DC-to-AC converter. The regulator is configured to control an AC output current of said circuit by controlling said DC voltage input to the DC-to-AC converter.

19 Claims, 11 Drawing Sheets

U.S. PATENT DOCUMENTS

| | | | |
|---|---|---|---|
| 6,346,451 B1 | 2/2002 | Simpson et al. | |
| 6,472,254 B2 | 10/2002 | Cantarini et al. | |
| 6,693,327 B2 | 2/2004 | Priefert et al. | |
| 6,768,180 B2 | 7/2004 | Salama et al. | |
| 6,950,323 B2 | 9/2005 | Achleitner et al. | |
| 7,315,052 B2 * | 1/2008 | Alter | 257/288 |
| 7,361,952 B2 * | 4/2008 | Miura et al. | 257/330 |
| 7,405,117 B2 | 7/2008 | Zuniga et al. | |
| 7,463,500 B2 | 12/2008 | West | |
| 7,482,238 B2 * | 1/2009 | Sung | 438/335 |
| 7,838,389 B2 * | 11/2010 | Radic et al. | 438/424 |

FOREIGN PATENT DOCUMENTS

| | | |
|---|---|---|
| JP | 61 137365 | 6/1986 |
| WO | WO 2004/053993 | 6/2004 |
| WO | WO 2004/100348 | 11/2004 |

* cited by examiner

INTEGRATED CIRCUITS AND POWER SUPPLIES

This invention relates to power integrated circuits for power conditioning units, that is circuits to supply power to a mains supply, such as domestic grid mains from, for example, a fuel cell or photovoltaic device, and also to circuits for supplying power to a mains supply, such as domestic grid mains, from a dc supply from a low voltage power source such as a photovoltaic device or fuel cell.

In this specification we are particularly concerned with semiconductor-on-insulator, in particular silicon-on-insulator integrated circuits bearing power semiconductor devices, that is power MOS transistors, insulated gate bipolar transistors (IGBTs), thyristors, double gate devices and the like, alongside low voltage devices performing a driver or control function. When we refer to power devices we are generally referring to high voltage devices which typically operate with a voltage in the range 100 volts to 1.2 kilovolts (or higher) and at powers of greater than 2 Watts. In the context of integrated circuits for power conditioning units, power devices are devices involved in the conduction of power from a (dc) input, for example a PV (photovoltaic) device or fuel cell, to an (ac) output, typically a mains power supply or grid output.

For devices designed for use in integrated circuits, the main terminals (variously called the anode/cathode, drain/source and emitter/collector) and the control terminals (termed the gate or base) are sometimes placed at the surface of the device in order to be easily accessible. The main current flow is between the main terminals and is therefore principally lateral and such devices are therefore typically referred to as lateral devices. Such devices are often integrated with low-voltage devices or circuits built in CMOS-type or other standard planar technologies to form power integrated circuits. Several high voltage/power devices may be integrated in the same chip. Isolation is conventionally provided between the high-power and the low-power devices as well as between adjacent power devices.

For discrete devices or hybrid circuits used in high voltage or power electronics, the main terminals may have a vertical orientation and may be placed at opposite sides of the wafer (e.g. with the low voltage terminal at the top and the high voltage terminal at the bottom); in other configurations vertical devices may have electrodes on the same face of the wafer. These devices are referred to as vertical high voltage/power devices. Compared to lateral devices, the current flow between the main terminals is principally vertical and this can facilitate a larger current capability and a higher breakdown voltage. It is straightforward to fabricate a single vertical device alongside one or more lateral devices although it is harder to fabricate a plurality of vertical devices alongside one or more lateral devices. Examples of known high voltage/power devices are DMOS & Trench MOSFETs, DMOS & Trench IGBTs and superjunction MOS or Cool MOS™.

Two isolation technologies may be used, junction-isolation (JI) technology and semiconductor (silicon)-on-insulator (SOI) technology. In JI technology, a reverse-biased junction is used to isolate adjacent devices, hi SOI technology, a buried insulating layer (oxide), BOX, is used to isolate vertically the top semiconductor layer from the bottom semiconductor. Horizontal or lateral isolation in SOI is typically provided via trenches which are filled with oxide or by use of the known LOCOS ("local oxidation of silicon") isolation; SOI technologies include Unibond, SIMOX (separation by implantation of oxygen), Silicon-on-Diamond (SOD) and silicon-on-sapphire technology. These two isolation technologies may be employed for a range of high voltage power devices including, but not limited to, a thyristor, LILET (lateral inversion layer emitter thyristor), SCR rectifier, LDMOSFET, Super Junction LDMOSFET, LIGBT (lateral IGBT), bipolar transistor, and JFET (junction FET) and, more generally, to both lateral and vertical devices.

Background prior art relating to power conditioning circuits can be found in: "Grid Connected PV Inverter using a Commercially Available Power IC", A. Mumtaz, N. P. van der Duijn Schouten, L. Chisenga, R. A. MacMahon and G. A. J. Amaratunga presented in October 2002 at the PV in Europe conference in Rome, Italy (referring to the Hitachi ECN 3067 integrated circuit and to the ST Microelectronics L298), AU58687, U.S. Pat. No. 6,151,234, AU 2073800, EP 1035640, NL 1011483C, U.S. Pat. No. 4,626,983 A, EP 0628901 A, U.S. Pat. No. 6,603,672 B, JP 2002 354677 A and JP 4 364378 A.

Broadly speaking, an alternating current mains supply at either 110 volts or 230/240 volts is provided from a fuel cell, photovoltaic device or other supply using an inverter circuit. For example a standard photovoltaic (PV) panel provides approximately 20 volts DC at around 4.5 amps maximum and this voltage must be stepped up and converted to alternating current to provide a mains output. This is generally done using an inverter constructed from discrete electronic components to convert the low DC input voltage to a high AC output voltage. Alternatively, there may be an initial step to step up the DC voltage before converting it to an AC voltage.

Some improved power conditioning circuits are described in the Applicant's co-pending PCT patent application GB2004/001965 (WO2004/100348), the contents of which are hereby incorporated by reference. This describes a power conditioning circuit for providing power from a device such as a photovoltaic (PV) device or fuel cell to an alternating current mains power supply line. More specifically, a DC-to-AC converter in the circuit preferably comprises a plurality of MOSFETs and, preferably, a DC-to-DC converter precedes the DC-to-AC converter and comprises a plurality of IGBTs. The circuit described therein may be used with the typical mains voltages of 110 volts and 230/240 volts or with other mains voltages and, although it is particularly suitable for supplying power to grid-mains, it may also be used to provide a direct mains supply to an appliance, for example a television. The circuit may also include an interface for a rechargeable battery to allow power to be supplied both to the mains and for battery-powered devices. In GB2004/001965 preferably much of the power conditioning circuit is implemented on a single integrated circuit.

Such devices require drivers, such as CMOS drivers, which are generally separate from the power devices. In the case of circuits operating at relatively high voltages, good isolation between the power devices and their drivers is important. For high voltage power devices, silicon on insulator (SOI) technology is generally used (although junction isolation technology may also be employed) with vertically-integrated devices. However, this does not permit integration of the power devices and drivers because of the underlying buried oxide (BOX) layer, which inhibits connection between the two. Therefore, the power devices of the previously described circuit comprise laterally-integrated devices such as lateral IGBTs and lateral tower MOSFETs such as LDMOSFETs (Lateral Double-diffused MOSFETs) in either CMOS or DMOS technology. This allows the (CMOS) drivers, which preferably also incorporate level shift and timing synchronisation elements) to be integrated on the same substrate as the power devices, optionally also with additional analogue circuitry, such as operational amplifiers or power factor correction and the like.

Integrated Circuits

We here describe how vertical and lateral devices may be integrated onto a single substrate, preferably in conjunction with associated driver circuitry, to provide an improved power conditioning device.

According to a first aspect of the present invention there is therefore provided a semiconductor, preferably silicon, -on-insulator integrated circuit die comprising a semiconductor, preferably silicon, -on-insulator substrate bearing a power conditioning circuit, the power conditioning circuit comprising at least two power devices, one of said power devices being a lateral power device, another of said power devices being a vertical power device.

By integrating a vertical power device and a lateral power device on a single, common substrate the area of the die is reduced thus making the application cheaper and more efficient. Here such a power device is preferably able to handle, substantially continuously, at least 10 W, 50 W or 100 W or more.

Vertical devices generally provide greater current handling capabilities and are cheaper in terms of silicon area than lateral devices for a given blocking voltage (since blocking voltage is determined by substrate thickness rather than a lateral substrate dimension) and thus integrating a vertical device and a lateral device on a common substrate, in embodiments facilitates implementation of the power circuit.

Preferably the lateral power device or devices (where there is more than one) is formed on an upper side of the substrate, allowing an underside of the lateral device to form part of a conductive region of the vertical device (it will be appreciated that references to the "upper" and "lower" are arbitrary, depending upon the orientation of the substrate).

Preferably the conductive region comprising a main terminal region of the vertical device; in embodiments this may extend substantially the length of the substrate in one or both lateral dimensions. Such a main terminal structure may also be employed to be partly shield the one or more lateral devices.

In embodiments the vertical device is a trench device configured to provide at least partial trench isolation for the lateral device or devices.

In preferred embodiments the power conditioning circuit comprises a DC-to-DC converter and a DC-to-AC converter the vertical device comprising part of the DC-to-DC and the one or more lateral devices comprising part of the DC-to-AC converter. Preferably the vertical device comprises a power switching device, for example part of a flyback, boost or buck converter circuit. The one or more lateral devices may comprise a bridge circuit. In embodiments of the integrated circuit only a single vertical device is provided.

In embodiments the integrated circuit may comprise a substantially complete chip power conditioning circuit (apart from passive power components as inductors, capacitors and resistors) to input low voltage DC and provide a mains voltage output.

Power Conditioning Circuits

Figure 1:
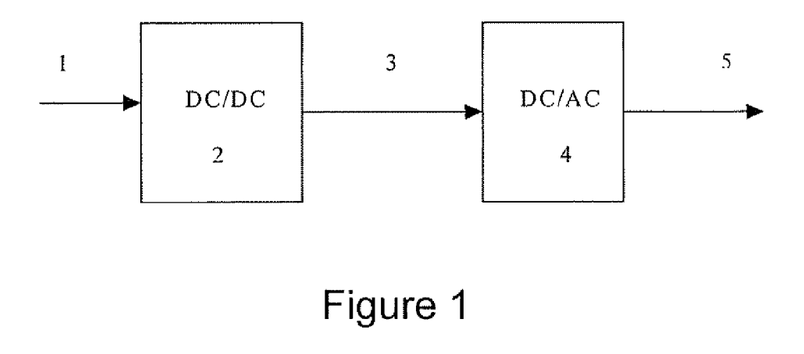
FIG. 1 shows a block diagram of a conventional power conditioning circuit.

FIG. 1 shows a block diagram of a conventional power conditioning circuit. This comprises a DC input 1 from a power generator such as a photovoltaic module or fuel cell, this providing an input into a DC-to-DC converter 2, typically comprising a high frequency transistor bridge, a transformer, and a rectifier. The output of DC-to-DC converter 2 comprises a DC link voltage 3, this providing an input into a DC-to-AC converter 4, typically comprising one or more transistors which convert the DC link voltage to a suitable low frequency AC voltage, for example at 50 Hz, the output 5 of this circuit being provided to a load (not shown).

The arrangement of FIG. 1 suffices for many power applications and, for example, embodiments of the above described integrated circuit may be employed to provide an improved power conditioning circuit. However an improved arrangement would also be of benefit.

Therefore according to a further aspect of the present invention is provided a power conditioning circuit for providing power from a DC supply to an alternating current mains power supply line, the circuit comprising: a DC input to receive DC power from said DC supply; an AC output for connection to said AC mains power supply line; a DC-to-DC converter having an input coupled to said DC input and having an output; a DC-to-AC converter having a DC input and an AC output to convert DC power to AC power for output onto said power supply line; and a DC voltage regulator coupled between the output of said DC-to-DC converter and the input of said DC-to-AC converter to regulate said DC voltage input to said DC-to-AC converter.

By regulating the DC link voltage, in embodiments more accurate regulation of the inverter output voltage can be achieved than with conventional systems. Preferably the regulator is configured to control an AC output current of the circuit by controlling the DC voltage input to the DC-to-AC converter, that is by controlling the DC link voltage. This facilitates DC-to-AC power regulation by regulating the current flow in grid-connected distributed power systems.

Thus the invention also provides a method of controlling an AC output current from a power conditioning circuit providing power from an input DC supply to an AC mains power supply line, the method comprising: converting said input DC supply from a first DC voltage to a second DC voltage; regulating said second DC voltage; and converting said regulated second DC voltage to an AC voltage for output to said AC mains power supply line.

In a related aspect the invention provides a power conditioning circuit for controlling an AC output current from a power conditioning circuit providing power from an input DC supply to an AC mains power supply line, the circuit comprising: means for converting said input DC supply from a first DC voltage to a second DC voltage; means for regulating said second DC voltage; and means for converting said regulated second DC voltage to an AC voltage for output to said AC mains power supply line.

In a further related aspect the invention provides a power conditioning circuit for providing power from a DC supply to an alternating current mains power supply line, the circuit comprising: a DC input to receive DC power from said DC supply; an AC output for connection to said AC mains power supply line; a DC-to-DC converter having an input coupled to said DC input and having an output; a DC-to-AC converter having a DC input and an AC output to convert DC power to AC power for output onto said power supply line; a filter between said DC-to-AC converter AC output and said AC output for connection said mains power supply line; and means to control an AC mains output current from said circuit responsive to a difference between said DC-to-AC converter AC output and said mains power supply Sine AC voltage.

Features of the above different described aspects and embodiments of the invention, in particular of the integrated circuit and improved power conditioning circuits, may be combined.

These and other aspects of the invention will now be further described, by way of example only, with reference to the accompanying Figures in which:

FIGS. 2a to 2c show, respectively, a block diagram of photovoltaic power supply system, a controller-to-grid interface, and a comparator and associated waveforms for the controller of FIG. 2a;

DETAILED DESCRIPTION

Figure 2A:
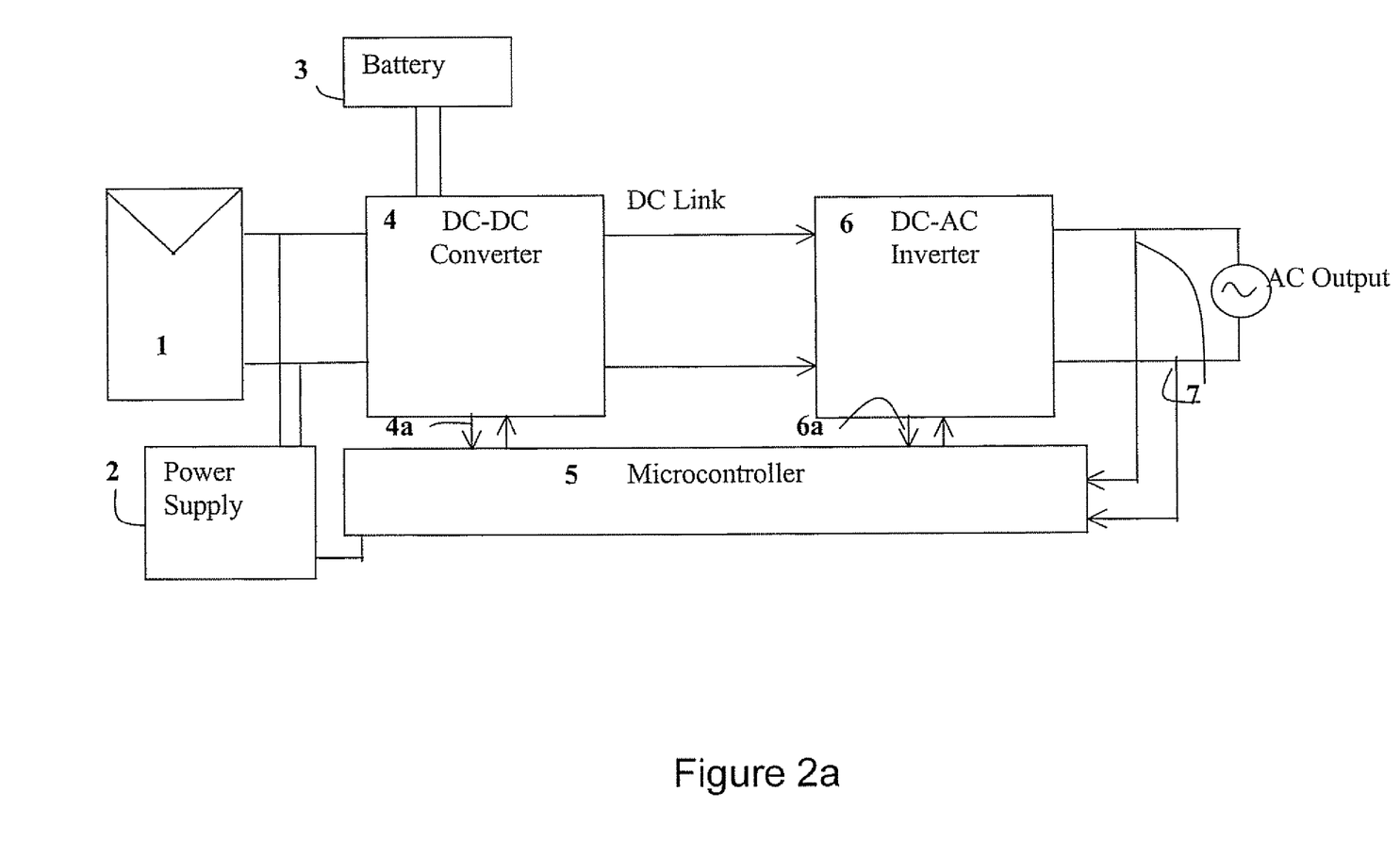
Figure 2B:
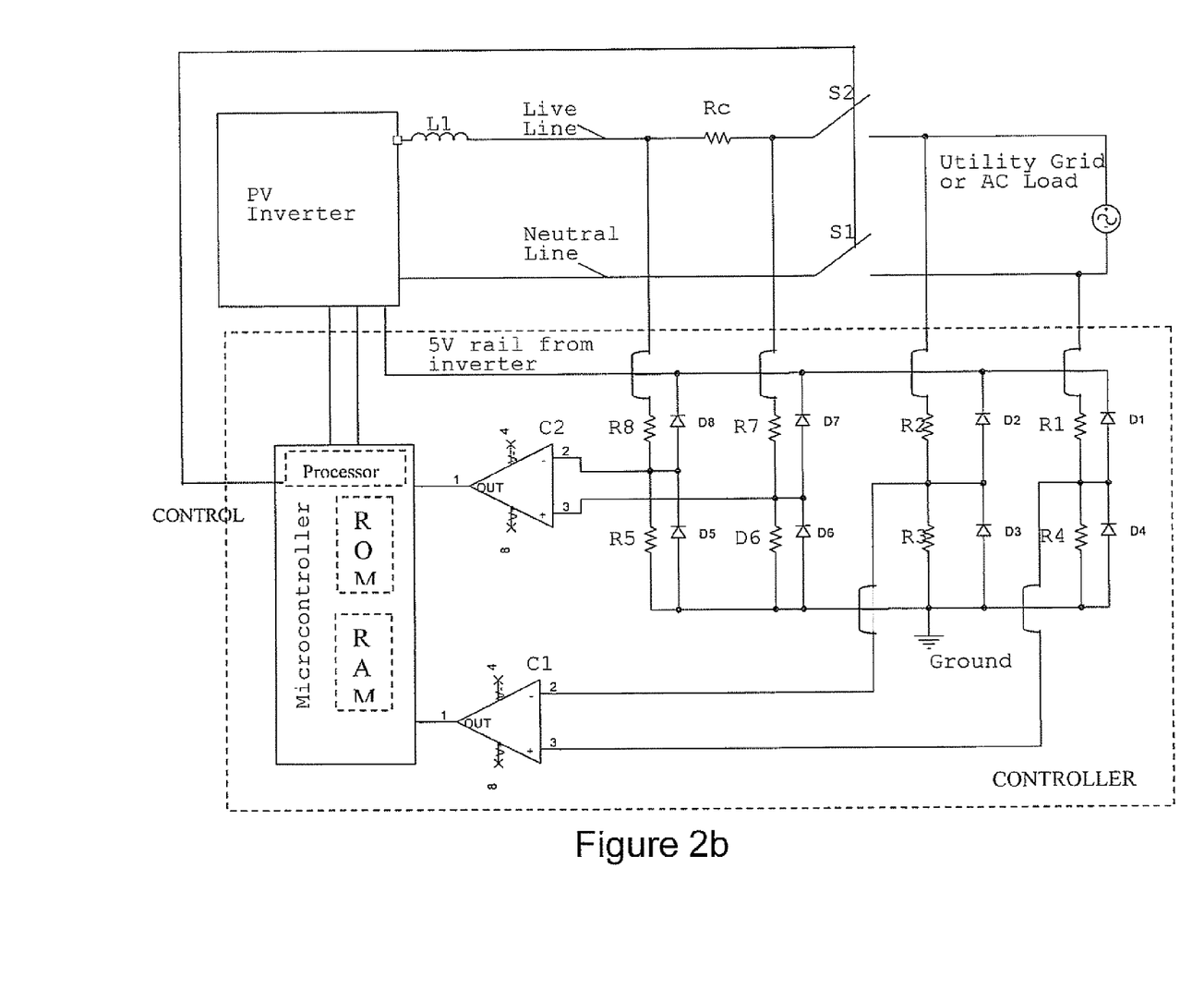
Figure 2C:
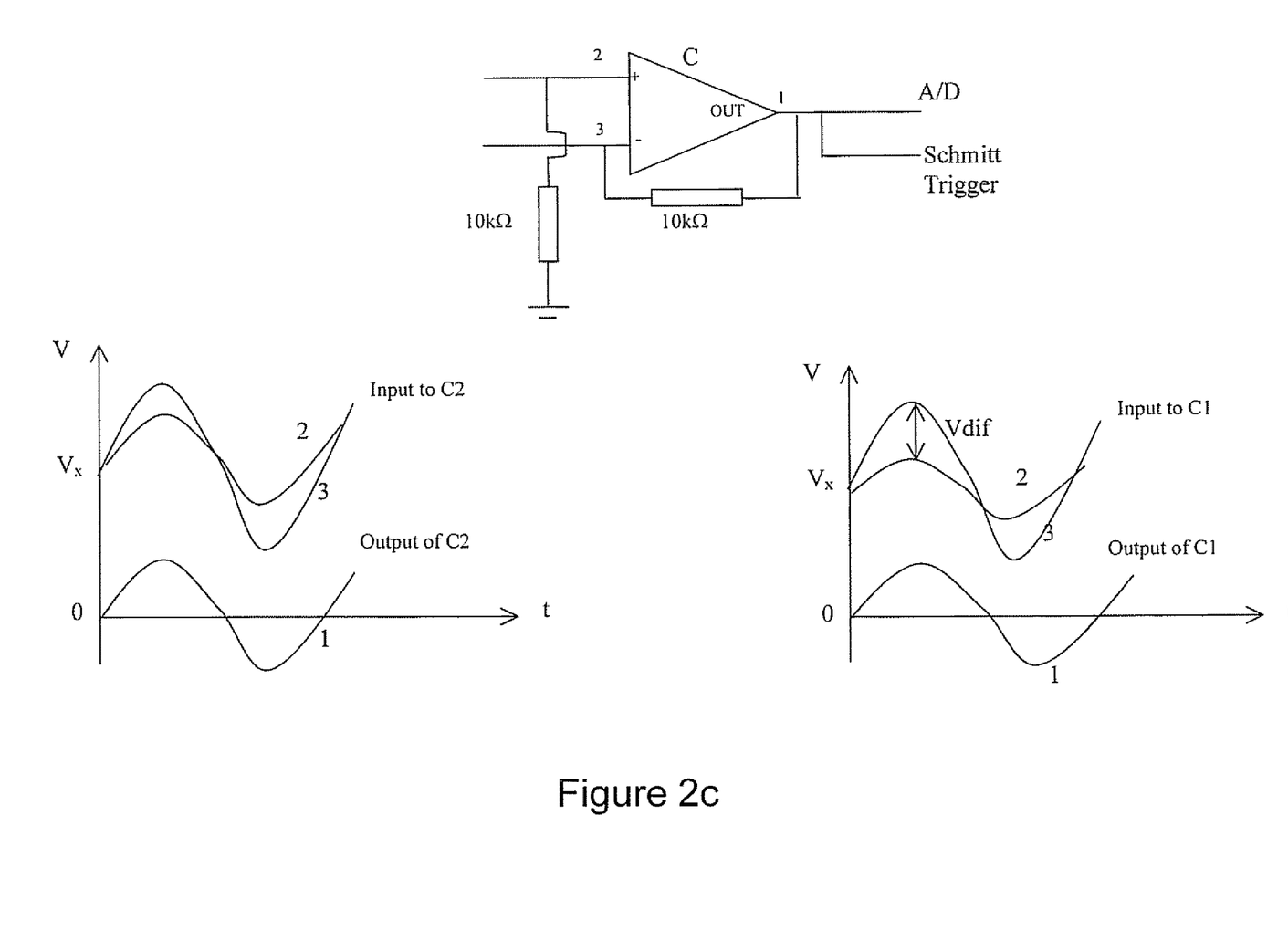
Figure 3:
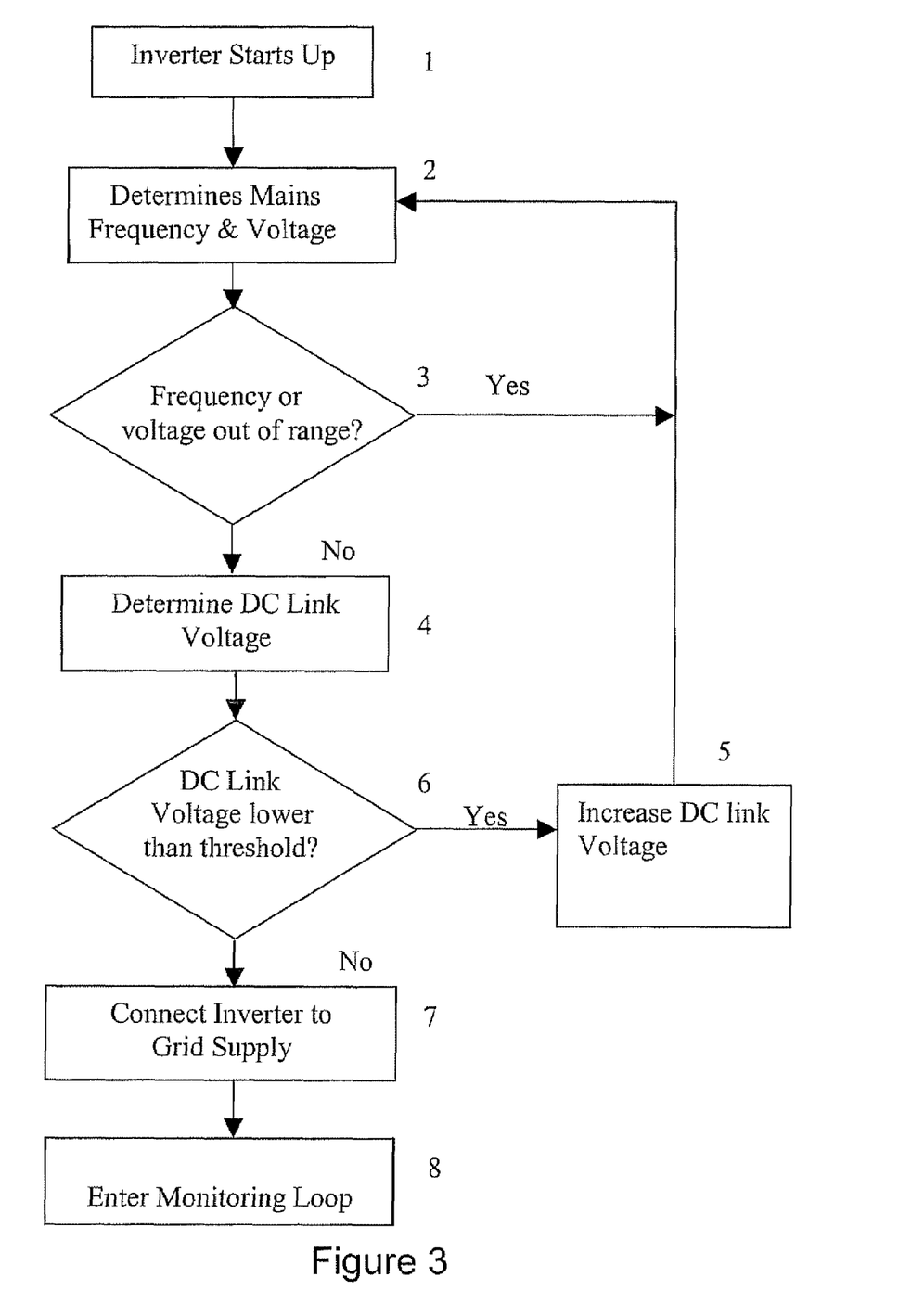
FIG. 3 shows a flow diagram of an inverter operation sequence.
Figure 4:
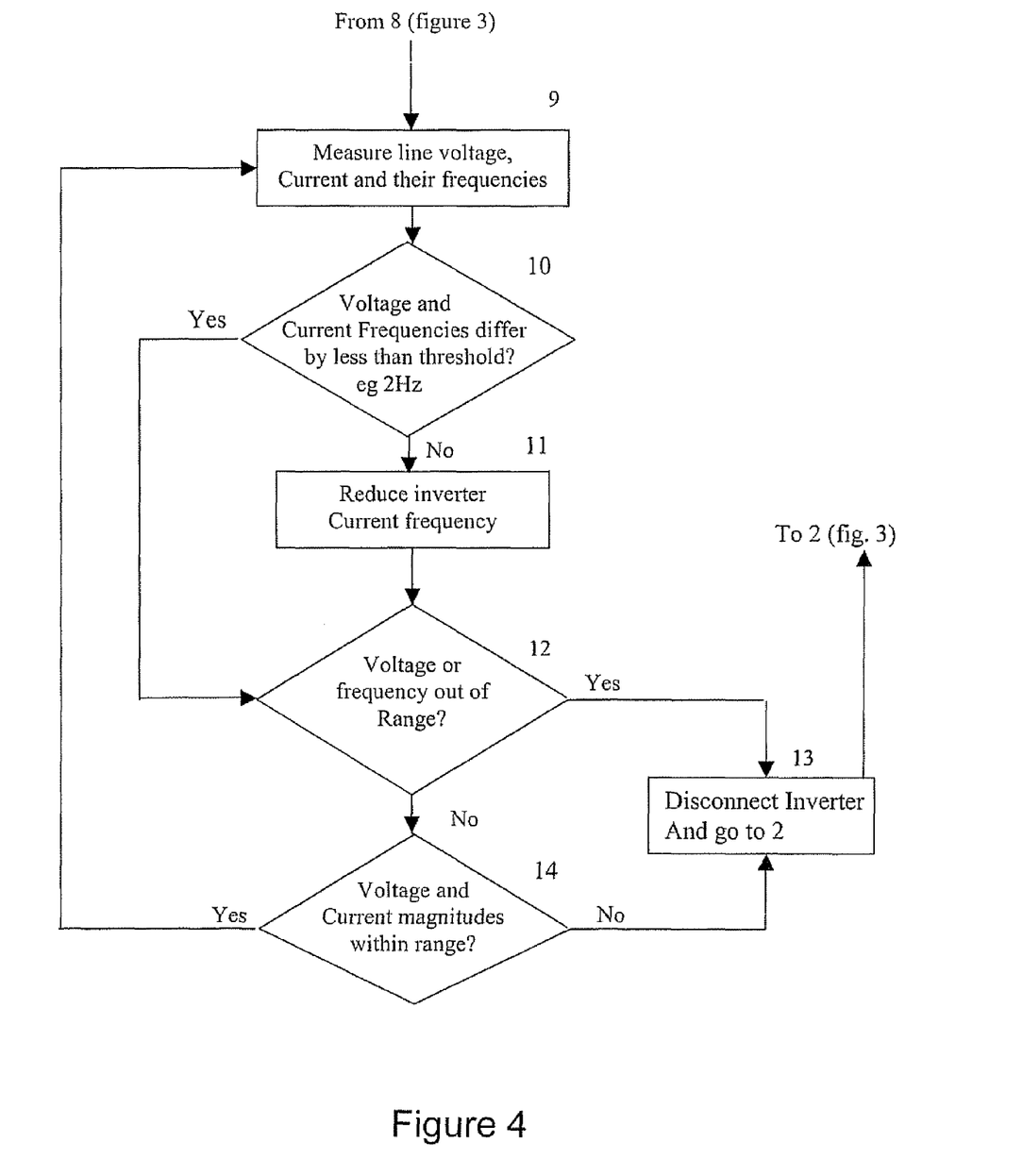
FIG. 4 shows a flow diagram of a grid-connection monitoring process.

FIGS. 2 to 4 are taken from GB2004/001965, and are included by way of background.

Referring to FIG. 2a this shows an overall block diagram of a grid-connected photovoltaic inverter and battery controller. The photovoltaic module is shown as object 1 in FIG. 1, which is connected to the DC to DC converter. The 5V rail for the microcontroller is generated using the power supply (2), which takes the input directly from the photovoltaic module. The microcontroller is connected to the DC-DC converter 4, DC-AC converter 6 and the output 7. Depending on the condition that the controller senses at 7 point it varies the control of the power conditioning blocks via control connections 4a and 6a accordingly. The illustrated configuration is also designed to charge a battery 3, shown connected from the DC-DC converter block.

FIG. 2b shows an example of microcontroller to grid interface configuration. The figure shows how the PV inverter is connected to the mains and shows the configuration of the feedback to inverter via the microcontroller. The microcontroller is used to monitor the power quality of the inverter and the grid interface. This is done by monitoring and controlling the magnitude, phase and frequency of both the current and voltage at the point of connection of the inverter and the grid. The grid is a high voltage/current (typically, 240 V AC) supply or load where as the microcontroller is a low power device (power supply of typically 5V).

R1 through to R8 are potentiometer resistors. These are used to adapt the high line voltages. In one embodiment the upper resistors are 2MΩ whereas the lower ones are either 10KΩ or 40KΩ. Rc is a current sensing resistor which in one embodiment has a value of approximately 2Ω. D1 through to D8 are protection diodes. These diodes ensure that the connection point of each pair of resistors does not attain voltages of over the supply voltage labelled above. The result of this is that the comparators C1, C2, and the microcontroller are protected from the high voltages and currents present in the power lines, live and neutral. C1 and C2 further buffer the magnitude and frequency of the current and voltage signals coming from the potential dividers, before connection to the microcontroller.

FIG. 2c shows details of a comparator set-up (top) for C1 and C2 and also input and output waveforms for comparators C1 and C2. The comparator has two inputs (−/+) inverting and non-inverting. Two resistors, one in feedback loop and the other grounded, are used to configure the comparator in an amplifier mode. The output is connected to an onboard microcontroller schmitt trigger and an A/D converter. The two inputs to the comparator are differential and the resultant output from the comparator is no longer floating but zero centred output voltage. For comparator C1 the voltage from the live and neutral lines, which are floating and have a fixed 110V AC or 240V AC magnitude difference, are fed into the comparator. For comparator C2 the voltage difference is due to the voltage drop across the resistor Rc. The frequency of the signals input to the comparators is substantially the same for each case. This output is processed in two ways. It is sampled using an A/D converter on the microcontroller, which allows the frequency of the signals to be calculated. The same output from the comparator is also sent to a Schmitt trigger, which allows the magnitude of the signals to be established.

FIG. 3 shows the inverter operation sequence before grid connection. Before the inverter connects or reconnects, by closing switches S1 and S2 (shown in FIG. 2a), a number of conditions are to be determined and then checked to be within the required limits. The flow diagram in FIG. 3 shows steps that are performed by the inverter prior to connection. At the time of the microcontroller power-up (step 1), the inverter determines the frequency and voltage of the grid supply (step 2). If the frequency or voltage is found to be outside the desired range (step 3), the inverter stays unconnected in wait mode. At fixed intervals its checks the grid-supply (step 2) to establish if the supply has gone back to normal condition. In the case in which the grid supply voltage and frequencies are found to be desirable, the inverter then checks the DC link voltage to evaluate if it is sufficient to enable connection (step 4). If the DC link voltage happens to be below threshold, the inverter would step the voltage up until threshold is attained (step 5). The DC Link voltage may be varied in two ways. A multi-tap transformer or a boost step up circuit with variable duty cycle can be used. Once all conditions are checked and met, the switches S1 and S2 are closed, which is controlled by the microcontroller and the inverter is connected to the grid (step 7). The system then continues to monitor its operation in case of any abnormal condition, and disconnects if such abnormality prevails. Some of the conditions that are constantly monitored are discussed later (step 8).

FIG. 4 shows the flow diagram of the sequence steps involved in the monitoring process, which enable the system to disconnect if conditions occur that may adversely affect operation of the overall system. Some of the abnormal conditions are described below. Once the inverter has been connected, voltages, currents and their frequencies have to be observed (step 9). The frequencies are then compared to check if they are less than the required threshold (step 10). If so then the voltage is checked to find out if is out of the required range (step 12), if it is then the PV inverter is disconnected and returns to sequence before grid-connection (FIG. 3). If the current and voltage frequencies are not within the required threshold (step 10) then the current frequency is reduced (step 11) and then the voltage frequency is checked (step 12). If the voltage is found to be in range (step 12) then the current/voltage magnitudes are checked to establish if they are in the required range (step 14). If not then the PV inverter is disconnected (step 13) and enters the sequence of FIG. 3. If the magnitudes are within the necessary range then the PV inverter remains connected and follows through the loop periodically.

Some of the abnormal conditions that may occur in the system include over-current, over-voltage, under-voltage, over-frequency, under-frequency and islanding. The inverter temporarily disconnects when any of these conditions occur by using the above method. The abnormal current, voltage or voltage conditions may be a result of a faulty condition in the system, an overload or an under-load. Over-current is said to occur when more current than normal flows in power lines. Under-voltage is a state in which the line voltage dips below the lower set threshold. Over-voltage is a state in which the line voltage shoots above the lower set threshold. Over-frequency is said to occur when the line frequency goes above the upper threshold. Under-frequency is said to occur when the line frequency goes below the lower threshold.

Figure 5:
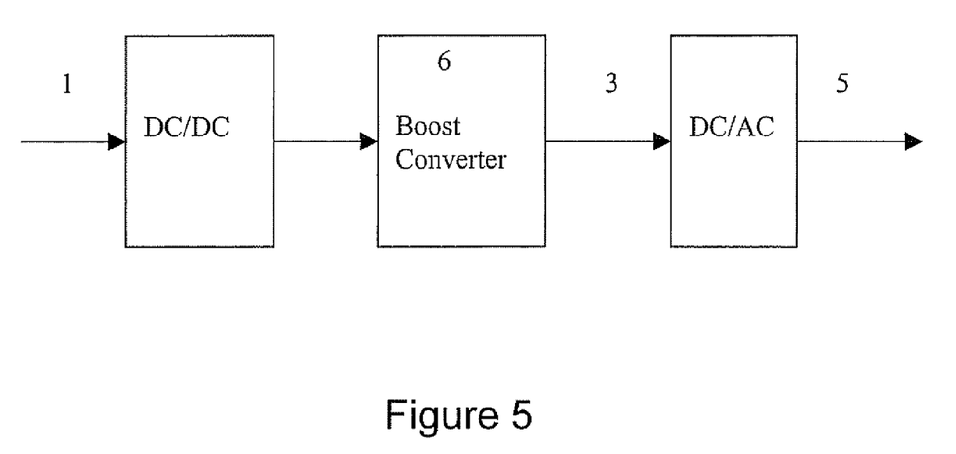
FIG. 5 shows a block diagram of an embodiment of a power conditioning system according to the present invention.
Figure 6:
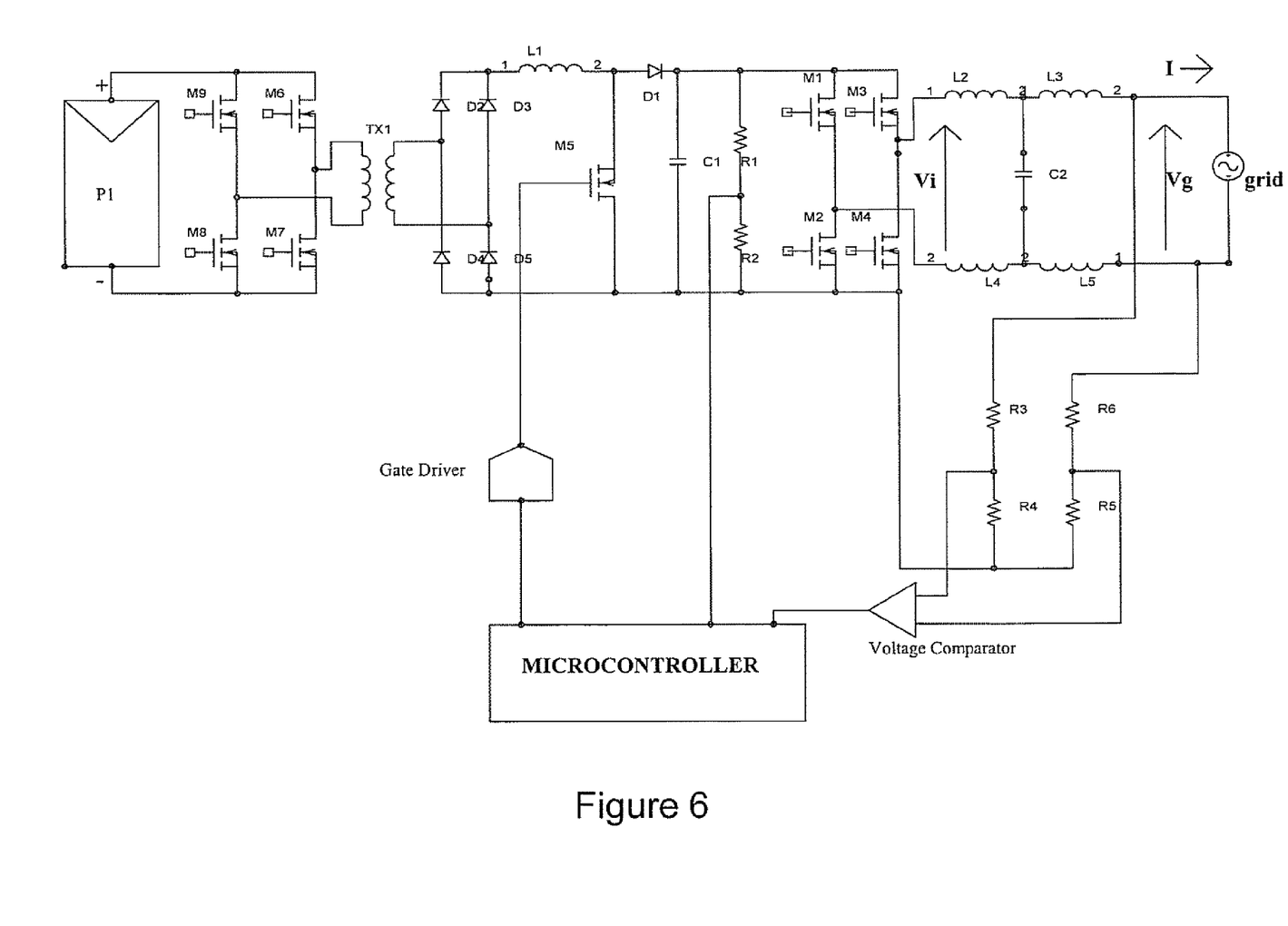
FIG. 6 shows a more detailed circuit diagram of the system of FIG. 5.

FIG. 5 shows a block diagram of an embodiment of a power conditioning system according to an aspect of the present invention; and FIG. 6 shows a more detailed circuit diagram of the system.

Referring to FIG. 5, like elements to those of FIG. 1 are indicated by like reference numerals. It can be seen that the design of FIG. 5 incorporates an active DC link comprising a boost converter 6 which accepts an unregulated DC link voltage input and provides a regulated DC link voltage output. In a conventional design the voltage at the output of the DC-to-DC converter is typically fixed by a transformer having a fixed terms ratio and regulation may also be applied at the DC input 1. However it is difficult to control the inverter AC output voltage in this way, and this technique lacks precision.

By incorporating means for regulating the DC link voltage more accurate control can be achieved without significant loss of efficiency.

In a preferred embodiment the boost converter stage 6 may comprise an inductor, a transistor and a diode.

Figure 7:
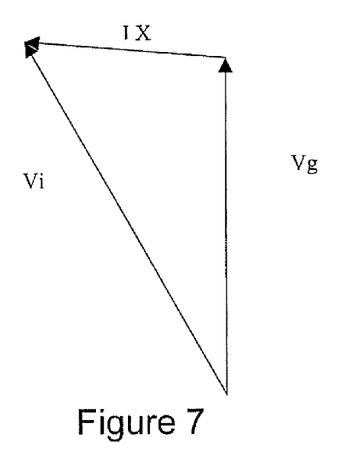
FIG. 7 shows an inverter and grid voltage relationship.

In FIG. 6, the region enclosed by the dotted rectangled constitutes the boost converter. A feedback loop is used to detect the amplitude of the grid (Vg). Depending on the amplitude, the duty cycle of the gate signal to the transistor M5 is varied to obtain the right inverter voltage Vi. FIG. 7 shows the inverter and grid voltage relationship.

In this phasor diagram, Vg is the grid voltage, Vi is the inverter output voltage, I is the current flowing into the grid and X is the reactance of the filter elements (L2-L5 and C2) and resistance of switching elements M1-M4. The boost converter controls the amplitude of Vi and thereby also setting the magnitude of I.

The DC link Control Circuit comprises R1 and R6, and the comparator, microcontroller and M5 gate driver. R3,R6 and R1 are high resistor values in mega ohms and R2,R4 and R5 are in kilo ohms so that no substantial losses occur in these components. The grid voltage Vg is sensed through the potential divider block of R3-R6 and the voltage comparator. The output of the comparator has the same shape, phase and frequency as Vg but of amplitude between 0 and 5V. This signal forms a reference for the magnitude, frequency and phase of Vg.

The potential divider of R1 and R2 provides a reference for the amplitude of Vi. Assuming the potential difference across C1 to be Vdc, equation 1 shows the relationship between Vi and Vdc:

$$Vi = mVdc \qquad \text{Equation 1}$$

where m is the modulation index, a number between 0 and 1.

Vdc is set by the duty cycle of the gate signal to M5. The microcontroller is configured to adjust the duty cycle depending on Vg and Vdc to ensure that the phasor of FIG. 7 holds.

In a preferred embodiment, much of the power conditioning circuit is implemented on a single integrated circuit. We therefore now describe some particularly preferred integrated circuit architectures suitable for the above and other power conditioning circuits.

Figure 8:
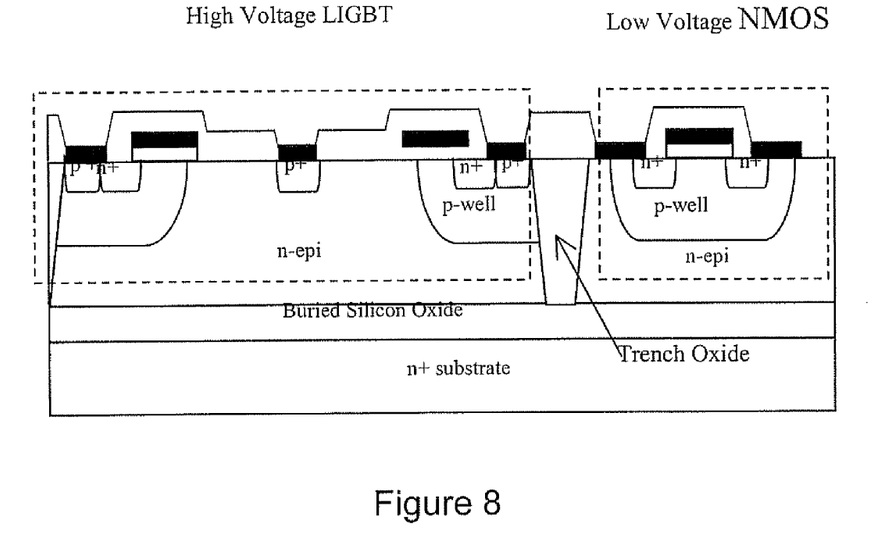
FIG. 8 shows a cross-sectional view of a Lateral IGBT alongside an NMOS device.

FIG. 8 shows a cross-sectional view of a Lateral IGBT alongside an NMOS device. Preferably the PV inverter comprises a monolithic circuit with its active components fabricated on single semiconductor substrate. In order to integrate the lateral MOSFETs, LIGBTs, and high voltage rectifier stage, there are two main requirements: a suitable fabrication process and an isolation process. Isolation is required in order that power devices do not interfere with each other and with the low voltage CMOS devices. The isolation in FIG. 8 can be seen to be provided by a vertical trench, which reaches down to the buried oxide. As will be understood by those skilled in the art a suitable fabrication process may be established by optimising a CMOS process to allow the integration of all the devices, with routine but extensive computer simulations. In particular the common layers such as P-well, N-well and N-drift are preferably optimised in order that these allow the operation of the devices to a satisfactory degree.

We previously described a dual stage inverter composed of an IGBT bridge and MOSFET bridge for the power conditioning unit including a boost stage. Here the first bridge MOSFET is reduced to single switch; the second stage boost and full bridge may be retained.

The single switch is a vertical device. The remaining power devices are lateral power devices. The integration of a single vertical switch with lateral logic devices has been produced previously. Most notably in the area of ignition chips for automotive applications. There are a number of suitable fabrication methods including power SIMOX.

The chip can be produced in Junction Isolation and Silicon On Insulator technologies. In junction isolated technology the p-substrate can be used for the vertical p-type device and n-wells for lateral power devices. In SOI devices the buried oxide is selectively removed to allow the formation of a single power device.

The three main components of a preferred embodiment of the integrated circuit are:

1. A Single Power Device

This is both a high voltage and high current device. The breakdown voltage could be, for example, 600V and current handling around 25 A.

2. Lateral High Voltage Devices

These devices are preferably able to sustain 600V for mains interconnection. They are preferably PWM controlled. To inhibit interaction between vertical and lateral devices an n+ implant may used above surface of the buried oxide.

3. Control Circuits

All control may also be integrated.

The preferred topology is the fly back circuit, which requires only one single front end switch. However other circuits can be used, for example the so-called Shimuzu circuit. Thus for example in FIG. 6 the four lateral MOSFET devices prior to the transformer could be replaced by a single vertical device, connected in series with the transformer (in other configurations a transformerless dc-to-dc converter could be employed).

Figure 9:
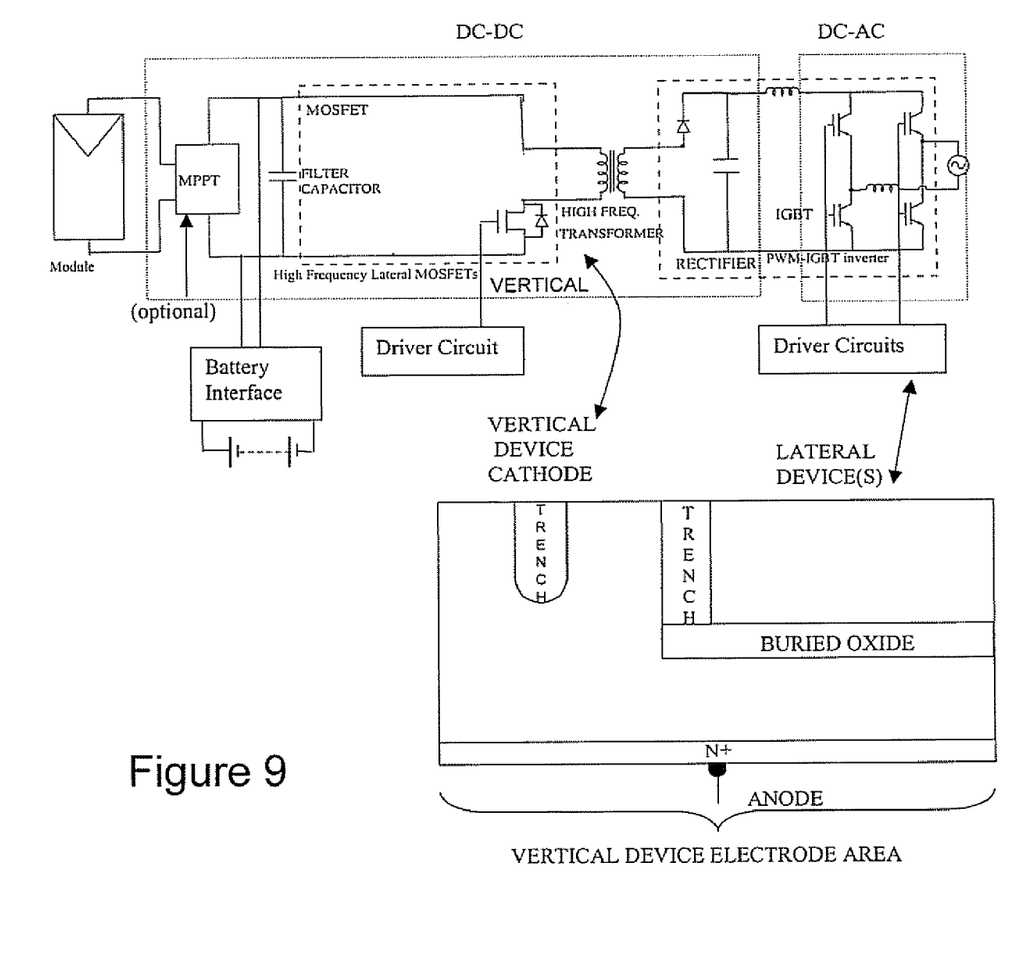
FIG. 9 shows an outline example of an integrated circuit embodying aspects of the present invention.

FIG. 9 shows an example of an integrated circuit embodying aspects of the present invention. The figure shows an implementation of a power conditioning unit, consisting a flyback circuit and full bridge interfacing the mains grid. The MOSFET of the flyback circuit is implemented using the vertical power device and other parts of circuit including the full bridge and driver circuits are implemented using multiple lateral power devices.

Figure 10:
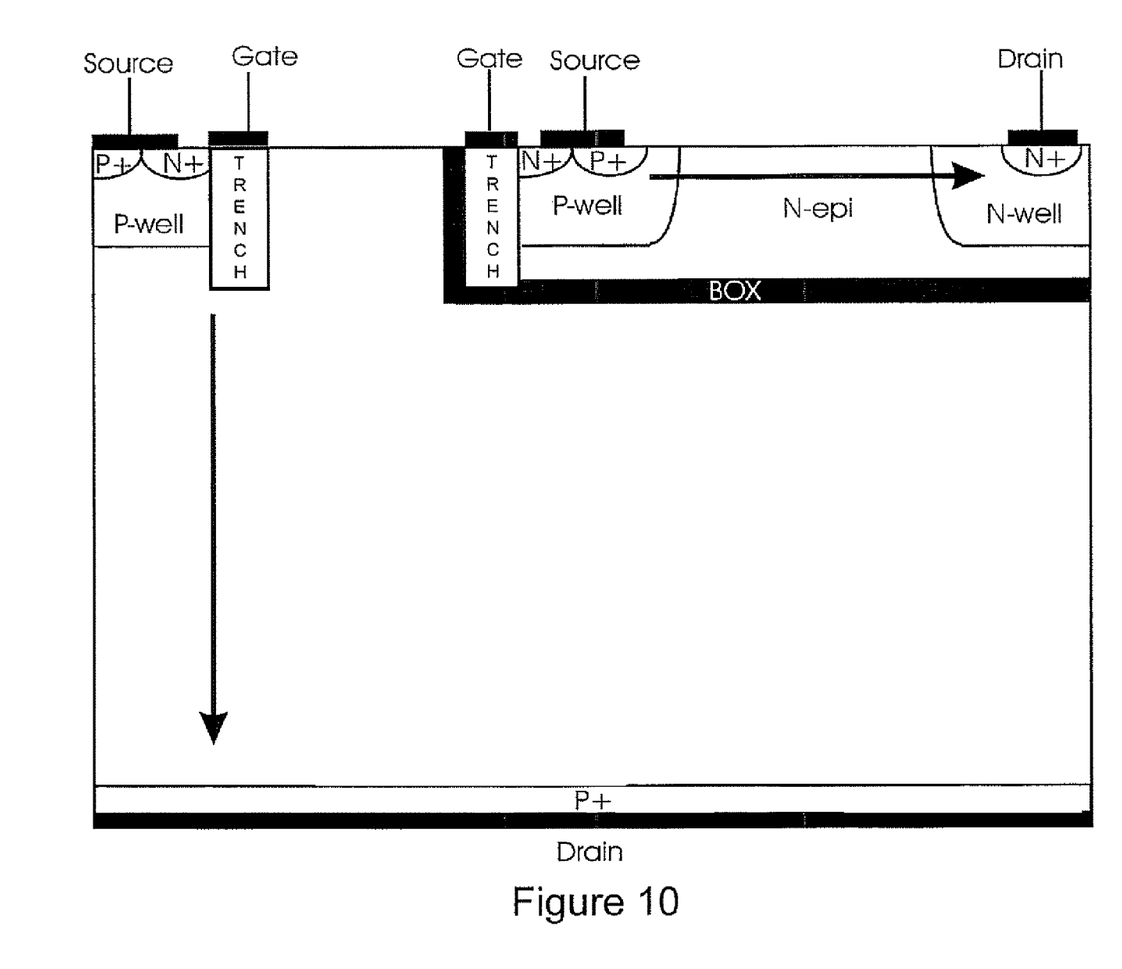
FIG. 10 shows a first detailed example of an integrated circuit according to embodiment of an aspect of the present invention.
Figure 11:
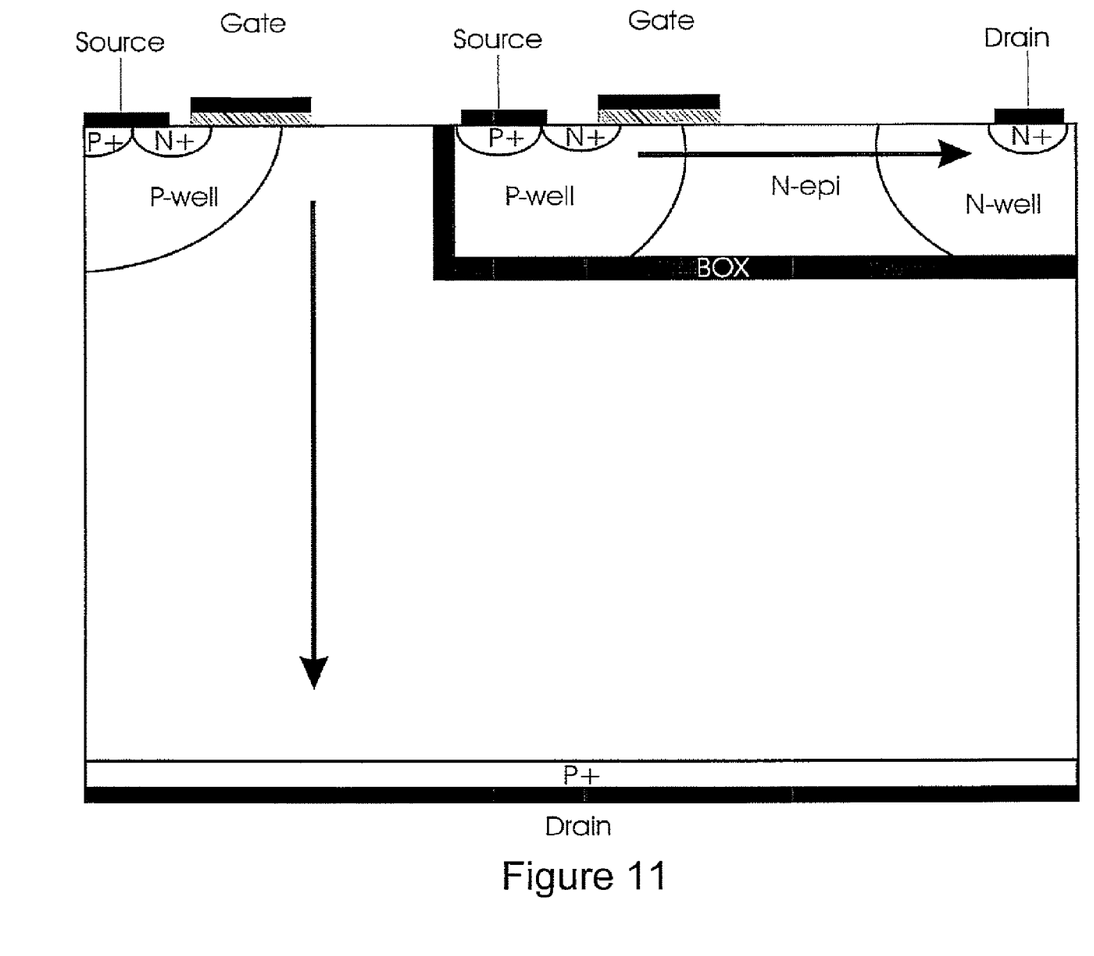
FIG. 11 shows a second detailed example of an integrated circuit according to embodiment of an aspect of the present invention.

In FIG. 9 one or more lateral devices, such as one or more IGBTs, are formed over the buried oxide, for example by conventional techniques well known to those skilled in the art. The additional trench in the vertical device is optional and is employed, for example, if a trench-gated structure is used. A detailed example of such a structure is shown in FIG. 10. FIG. 11 shows a detailed example of an integrated circuit without such an additional trench. Again, the vertical device may be fabricated by conventional techniques well known to those skilled in the art.

The skilled person will recognise that the techniques we describe herein are not limited to power conditioning circuits for photovoltaics and/or fuel cells and may also be applied to other type power conditioning circuits and to power circuits in general.

No doubt many effective alternatives will occur to the skilled person and it should be understood that the invention is not limited to the described embodiments but encompasses modifications within the spirit and scope of the claims.

The invention claimed is:

1. A semiconductor-on-insulator integrated circuit die comprising a substrate bearing a power conditioning circuit, the power conditioning circuit comprising at least two power devices, one of said power devices being a lateral power device, another of said power devices being a vertical power device.

2. An integrated circuit die as claimed in claim 1 wherein said lateral power device is formed on an upper side of said substrate, and wherein said vertical device includes a conductive region on an underside of said lateral device.

3. An integrated circuit die as claimed in claim 2 wherein said conductive region comprises a main terminal region of said vertical device.

4. An integrated circuit die as claimed in claim 3 wherein said main terminal region extends the substantially the length of said substrate in at least one lateral dimension.

5. An integrated circuit die as claimed in claim 1 wherein said vertical device includes a main terminal structure configured to at least partially shield said lateral device.

6. An integrated circuit die as claimed in claim 5 wherein said main terminal structure comprises an emitter structure.

7. An integrated circuit die as claimed in claim 1 wherein said vertical device is a trench device, and wherein said trench device is configured to provide at least partial trench isolation for said lateral device.

8. An integrated circuit die as claimed in claim 1 wherein said power conditioning circuit comprises a DC-to-DC converter coupled to a DC-to-AC converter, wherein said vertical device comprises part of said DC-to-DC converter, and wherein said lateral device comprises part of said DC-to-AC converter.

9. An integrated circuit die as claimed in claim 8 wherein said vertical device comprises a power switching device and wherein said lateral device comprises part of a bridge circuit.

10. An integrated circuit die as claimed in claim 1 further comprising a plurality of said lateral devices.

11. A single chip power conditioning circuit including an integrated circuit die as claimed in claim 1 wherein said power conditioning circuit includes low-voltage control circuitry integrated on said substrate.

12. A power conditioning circuit for providing power from a DC supply to an alternating current mains power supply line, the circuit comprising:
    a DC input to receive DC power from said DC supply;
    an AC output for connection to said AC mains power supply line;
    a DC-to-DC converter having an input coupled to said DC input and having an output;
    a DC-to-AC converter having a DC input and an AC output to convert DC power to AC power for output onto said power supply line; and
    a DC voltage regulator coupled between the output of said DC-to-DC converter and the input of said DC-to-AC converter to regulate said DC voltage input to said DC-to-AC converter; and
    wherein said regulator is configured to control an AC output current of said circuit by controlling said DC voltage input to said DC-to-AC converter.

13. A circuit as claimed in claim 12 further comprising a controller having a first input derived from said AC supply line and a second input derived from said DC voltage regulator output and a control output to said DC voltage regulator for regulating said DC voltage input to said DC-to-AC converter.

14. A circuit as claimed in claim 13 wherein said first input receives an AC voltage and said second input a DC voltage.

15. A circuit as claimed in claim 13 wherein said controller is configured to control a duty cycle of a power switch of said DC voltage regulator.

16. A circuit as claimed in claim 13 wherein said controller is configured to control an output voltage of said DC-to-AC converter to maintain a phase relationship between said output voltage of said DC-to-AC converter and a voltage of said AC mains power line.

17. A circuit as claimed in claim 13 including one or more reactive elements between said AC output of said DC-to-AC converter and a connection to said AC mains power line.

18. A power conditioning circuit as claimed in claim 12, the circuit further comprising:
    a filter between said DC-to-AC converter AC output and said AC output; and
    means to control an AC mains output current from said circuit responsive to a difference between said DC-to-AC converter AC output and said mains power supply line AC voltage.

19. A power conditioning circuit for controlling an AC output current from a power conditioning circuit providing power from an input DC supply to an AC mains power supply line, the circuit comprising
    means for converting said input DC supply from a first DC voltage to a second DC voltage;
    means for regulating said second DC voltage to control an AC output current by regulating said second DC voltage; and
    means for converting said regulated second DC voltage to an AC voltage for output to said AC mains power supply line.

* * * * *